(12) United States Patent
Tseng

(10) Patent No.: US 8,344,919 B2
(45) Date of Patent: Jan. 1, 2013

(54) PROCESSING SYSTEM COMPENSATING DC OFFSET AND GAIN ERROR

(75) Inventor: Chung-Lin Tseng, Zhongli (TW)

(73) Assignee: Industrial Technology Research Institute, Chutung (TW)

( * ) Notice: Subject to any disclaimer, the term of this patent is extended or adjusted under 35 U.S.C. 154(b) by 108 days.

(21) Appl. No.: 13/073,639

(22) Filed: Mar. 28, 2011

(65) Prior Publication Data

US 2012/0139765 A1 Jun. 7, 2012

(30) Foreign Application Priority Data

Dec. 3, 2010 (TW) ................................ 99142061 A

(51) Int. Cl.
*H03M 1/06* (2006.01)
(52) U.S. Cl. ........ 341/118; 382/209; 382/235; 382/283; 382/232; 341/156; 702/85; 702/104; 375/354; 375/296; 330/254
(58) Field of Classification Search .......... 341/118–156; 382/209, 232, 235, 283; 702/85, 104; 375/254, 375/296, 297
See application file for complete search history.

(56) References Cited

U.S. PATENT DOCUMENTS

| | | | | |
|---|---|---|---|---|
| 5,463,395 A * | 10/1995 | Sawai | ........................ | 341/156 |
| 5,498,984 A | 3/1996 | Schaffer | | |
| 5,604,684 A | 2/1997 | Juntunen | | |
| 5,844,512 A * | 12/1998 | Gorin et al. | .................... | 341/139 |
| 5,902,925 A | 5/1999 | Crispie et al. | | |
| 6,249,753 B1 | 6/2001 | Mason et al. | | |
| 6,937,175 B1 * | 8/2005 | Cruz-Albrecht et al. | ...... | 341/143 |
| 7,103,750 B2 * | 9/2006 | Helsley et al. | ................ | 382/209 |
| 7,202,805 B2 | 4/2007 | Sherry et al. | | |
| 7,330,140 B2 | 2/2008 | Balakrishnan et al. | | |
| 7,382,883 B2 | 6/2008 | Cross et al. | | |
| 7,429,945 B2 * | 9/2008 | Shiu et al. | ..................... | 341/156 |
| 7,474,235 B2 * | 1/2009 | Hsieh et al. | ..................... | 341/61 |
| 7,571,065 B2 | 8/2009 | Seesink | | |

(Continued)

FOREIGN PATENT DOCUMENTS

TW 200906070 2/2009

(Continued)

OTHER PUBLICATIONS

"Current Sense Circuit Collection"; Tim Regan; Linear Technology; Application Note 105; Dec. 2005.

(Continued)

*Primary Examiner* — Lam T Mai
(74) *Attorney, Agent, or Firm* — Wang Law Firm, Inc.; Li K. Wang; Stephen Hsu

(57) ABSTRACT

A processing system including a first processing module and a second processing module is disclosed. The first processing module transforms and amplifies a grounded signal to generate a first processed signal and transforms and amplifies a predetermined signal to generate a second processed signal. The second processing module transforms the first processed signal to a first digital code according to a first reference voltage group and transforms the second processed signal to a second digital code according to a second reference voltage group. The second processing module adjusts a third reference voltage group according to the first and the second digital codes, and during a normal mode, the second processing module generates a third digital code according to the adjusted third voltage group.

11 Claims, 16 Drawing Sheets

U.S. PATENT DOCUMENTS

| | | |
|---|---|---|
| 7,577,539 B2 | 8/2009 | Hubanks et al. |
| 7,822,147 B2 * | 10/2010 | Huang et al. ................ 375/296 |
| 7,903,006 B2 * | 3/2011 | Hsieh et al. ................ 341/110 |
| 8,149,146 B2 * | 4/2012 | Hsieh et al. ................ 341/61 |

FOREIGN PATENT DOCUMENTS

| | | |
|---|---|---|
| TW | 200910774 | 3/2009 |
| TW | 200937882 | 9/2009 |

OTHER PUBLICATIONS

"Simplifying Sensor Signal Conditioning, Part 1"; Nicholas Gray; EE Times-India.

"Single Supply, Auto-Zero Sensor Amplifier with Programmable Gain and Offset"; Texas Instruments; SBOS440A; Apr. 2009; PGA308.

* cited by examiner

US 8,344,919 B2

PROCESSING SYSTEM COMPENSATING DC OFFSET AND GAIN ERROR

CROSS REFERENCE TO RELATED APPLICATIONS

This application claims priority of Taiwan Patent Application No. 099142061, filed on Dec. 3, 2010, the entirety of which is incorporated by reference herein.

BACKGROUND

1. Technical Field

The disclosure relates to a processing system, and more particularly to a processing system compensating DC offset and gain error.

2. Description of the Related Art

With technological development, functions of various electronic elements have increased, and the sizes of electronic elements have reduced. The type of the electronic elements comprises digital elements and analog elements. Various elements are combined to form a specific circuit. Generally, the electronic elements are utilized to process signals. If the electronic elements have one error, such as an offset error or a gain error, the performance of the processing result is degraded.

SUMMARY

In accordance with an embodiment, a processing system comprises a first processing module and a second processing module. The first processing module transforms and amplifies a grounded signal to generate a first processed signal and transforms and amplifies a predetermined signal to generate a second processed signal. The second processing module transforms the first processed signal to a first digital code according to a first reference voltage group and transforms the second processed signal to a second digital code according to a second reference voltage group. The second processing module adjusts a third reference voltage group according to the first and the second digital codes, and during a normal mode, the second processing module generates a third digital code according to the adjusted third voltage group.

A detailed description is given in the following embodiments with reference to the accompanying drawings. It will be understood that when an element or layer is referred to as being "coupled to" another element, it can be indirectly coupled to the other element. When an element is referred to as being "connected to" another element, it can be directly connected to the other element.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

BRIEF DESCRIPTION OF THE DRAWINGS

The disclosure can be more fully understood by referring to the following detailed description and examples with references made to the accompanying drawings, wherein.

DETAILED DESCRIPTION OF THE DISCLOSURE

The following description is of the best-contemplated mode of carrying out the disclosure. This description is made for the purpose of illustrating the general principles of the disclosure and should not be taken in a limiting sense. The scope of the disclosure is best determined by reference to the appended claims.

Figure 1:
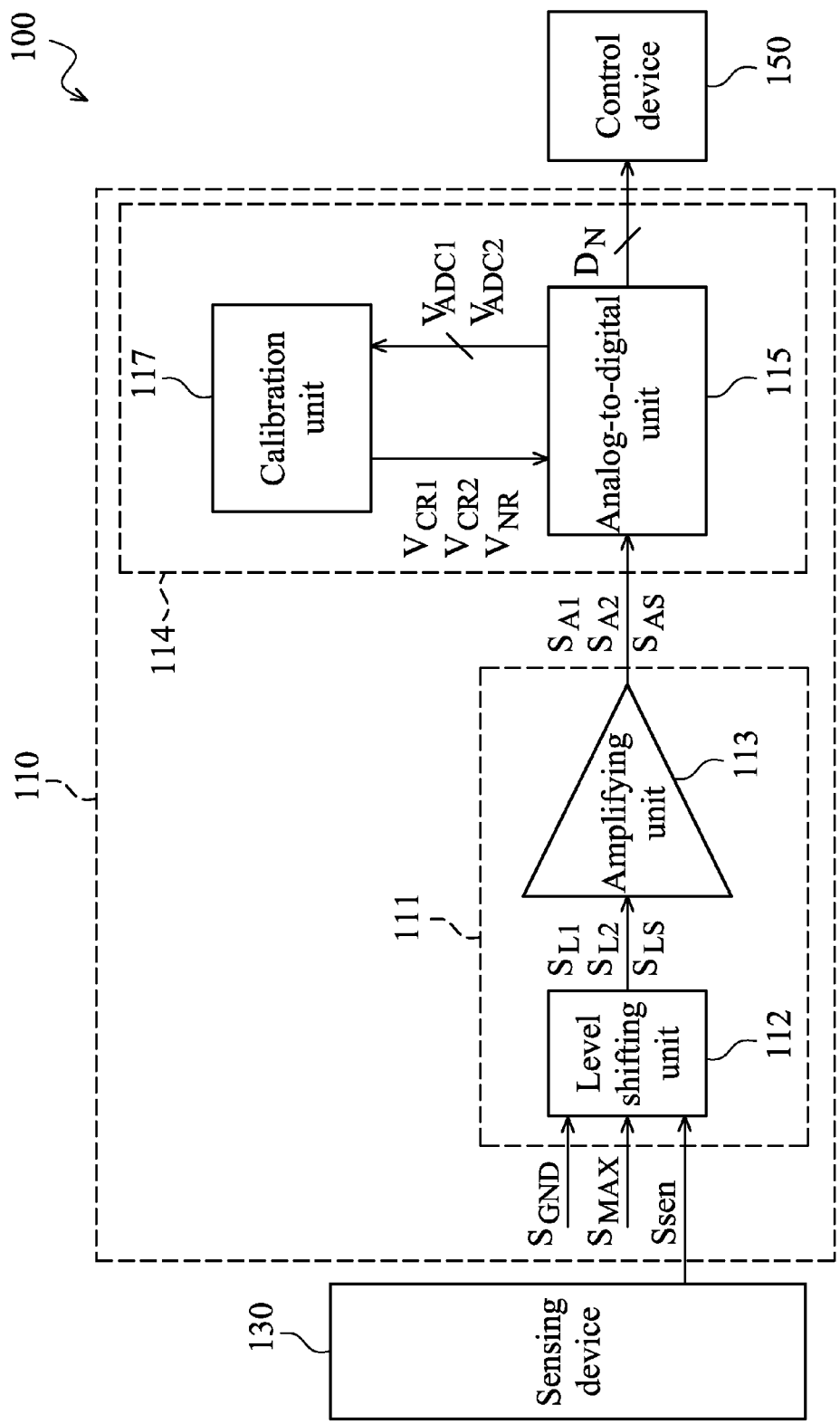
FIG. 1 is a schematic diagram of an exemplary embodiment of a processing system.

FIG. 1 is a schematic diagram of an exemplary embodiment of a processing system. The processing system 100 comprises a processing device 110, a sensing device 130 and a control device 150. The processing device 110 is coupled between the sensing device 130 and the control device 150. The sensing device 130 executes a sensing action to generate a sensed signal Ssen. The processing device 110 processes the sensed signal Ssen to generate a processed result $D_N$ and provides the processed result $D_N$ to the control device 150.

In this embodiment, the sensing device 130 comprises a sensor (not shown) to generate the sensed signal Ssen. The disclosure does not limit the type of the sensor. In one embodiment, the sensor is capable of detecting intensity of a light, temperature, pressure, magnetic field, weight, and so forth. Additionally, the disclosure does not limit the type of the sensed signal Ssen. In one embodiment, the sensed signal is in a voltage format or in a current format.

The control device 150 operates according to the processed result $D_N$ provided by the processing device 110. The disclosure does not limit the type of the control device 150. For example, the control device 150 is a micro-controller or a digital signal processor (DSP), but the disclosure is not limited thereto.

The processing device 110 can be operated in a first calibration mode, a second calibration mode and a normal mode. During the first calibration mode, the processing device 110 processes a grounded signal $S_{GND}$ to compensate for a DC offset generated by internal elements of the processing device 110. During the second calibration mode, the processing device 110 processes a predetermined signal $S_{MAX}$ to compensate for a gain error generated by internal elements of the processing device 110. Since the DC offset and the gain error are compensated for, when the processing device 110 receives the processed sensed signal Ssen generated by the sensing device 130, the processed result $D_N$ provided by the processing device 110 is not effected by the DC offset and the gain error. Thus, during the normal mode, the processing device 110 provides the processed result $D_N$ to the control device 150.

The disclosure does not limit the sequence of compensating for the DC offset and the gain error. In one embodiment, the DC offset is first compensated for and then the gain error is compensated for. In another embodiment, the gain error is first compensated for and then the DC offset is compensated for.

Additionally, the disclosure does not limit the method of generating the grounded signal $S_{GND}$ and the predetermined signal $S_{MAX}$. In this embodiment, the processing device 110 comprises a signal generator (not shown) to provide the grounded signal $S_{GND}$ and the predetermined signal $S_{MAX}$. In another embodiment, the grounded signal $S_{GND}$ and the predetermined signal $S_{MAX}$ are generated by an external signal generator (not shown). In this case, the external signal generator directly provides the grounded signal $S_{GND}$ and the predetermined signal $S_{MAX}$ to the processing device 110 or indirectly provides the grounded signal $S_{GND}$ and the predetermined signal $S_{MAX}$ to the processing device 110 via the sensing device 130. performance of the electronic elements is degraded When the sensing device 130 generates a slight sensed signal Ssen to the processing device 110, if the processing device 110 has a DC offset and a gain error, the performance of the processing device 110 is substantially degraded by the DC offset and the gain error. However, the DC offset and the gain error are compensated for in this embodiment. Thus, the processing device 110 is capable of processing the slight sensed signal Ssen and ensures that the processed result $D_N$ is not influenced by the DC offset and the gain error. The internal structure and operating of the processing device 110 are described in greater detail hereafter.

As shown in FIG. 1. the processing device 110 comprises processing modules 111 and 114. The processing module 111 processes an input signal (e.g. the grounded signal $S_{GND}$, the predetermined signal $S_{MAX}$ or the sensed signal Ssen) to generate a processed signal. In this embodiment, the processing module 111 transforms and amplifies the level of the input signal, but the disclosure is not limited thereto.

The disclosure does not limit the sequence of the transforming action and the amplifying action. In one embodiment, the processing module 111 first transforms the level of the input signal and then amplifies the transformed result. In another embodiment, the processing module 111 first amplifies the input signal and then transforms the amplified result.

In this embodiment, the processing module 111 comprises a level shifting unit 112 and an amplifying unit 113. During different modes, the level shifting unit 112 transforms different signals to generate transformed signals. For example, during the first calibration mode, the level shifting unit 112 transforms the level of the grounded signal $S_{GND}$ to generate a transformed signal $S_{L1}$. During the second calibration mode, the level shifting unit 112 transforms the level of the predetermined signal $S_{MAX}$ to generate a transformed signal $S_{L2}$. During the normal mode, the level shifting unit 112 transforms the level of the sensed signal Ssen, to generate a transformed signal $S_{LS}$.

In one embodiment, the predetermined signal $S_{MAX}$ is a maximum sensed signal generated by the sensing device 130. In another embodiment, the level shifting unit 112 is a level shifter.

The amplifying unit 113 amplifies the output signal of the level shifting unit 112 to generate a corresponding amplified signal. In this embodiment, the amplifying unit 113 amplifies the transformed signals $S_{L1}$ and $S_{L2}$ to generate amplified signals $S_{A1}$ and $S_{A2}$ respectively. In one embodiment, the amplifying unit 113 comprises a gain amplifier.

The processing module 114 transforms a processed signal (e.g. the amplified signal $S_{A1}$) to a digital code $V_{ADC1}$ according to a reference voltage group $V_{CR1}$ and transforms another processed signal (e.g. the amplified signal $S_{A2}$) to a digital code $V_{ADC2}$ according to another reference voltage group $V_{CR2}$. The processing module 114 adjusts a reference voltage group $V_{NR}$ according to at least one of the digital codes $V_{ADC1}$ and $V_{ADC2}$. During a normal mode, the processing module 114 transforms the output signal (e.g. $S_{AS}$) of the processing module 111 to generate a digital code $D_N$ according to the adjusted reference voltage group $V_{NR}$.

In this embodiment, the processing module 114 comprises an analog-to-digital unit 115 and a calibration unit 117. During different modes, the analog-to-digital unit 115 transforms the output signal of the processing module 111 from an analog format to a digital format according to different reference voltage groups.

For example, during a first calibration mode, the analog-to-digital unit 115 transforms the amplified signal $S_{A1}$ to the digital code $V_{ADC1}$ according to the reference voltage group $V_{CR1}$. During a second calibration mode, the analog-to-digital unit 115 transforms the amplified signal $S_{A2}$ to the digital code $V_{ADC2}$ according to the reference voltage group $V_{CR2}$. During a normal mode, the analog-to-digital unit 115 transforms the amplified signal $S_{AS}$ to the digital code $D_N$ according to the reference voltage group $V_{NR}$. In one embodiment, the analog-to-digital unit 115 is an analog-to-digital converter (ADC).

The disclosure does not limit the relationship among the reference voltage groups $V_{CR1}$, $V_{CR2}$ and $V_{NR}$. In one embodiment, one voltage among the reference voltage group $V_{CR1}$ is equal to a minimum voltage of the reference voltage group $V_{NR}$. For example, a middle voltage of the reference voltage group $V_{CR1}$ is equal to a minimum of the reference voltage group $V_{NR}$. In another embodiment, one voltage among the reference voltage group $V_{CR2}$ is equal to a maximum voltage of the reference voltage group $V_{NR}$. For example, a middle voltage of the reference voltage group $V_{CR2}$ is equal to a maximum of the reference voltage group $V_{NR}$.

The calibration unit 117 adjusts the reference voltage group $V_{NR}$ according to the digital codes $V_{ADC1}$ and $V_{ADC2}$ output from the analog-to-digital unit 115. In this embodiment, the reference voltage group $V_{NR}$ comprises predetermined reference voltages $Vref_H$ and $Vref_L$. The predetermined reference voltage $Vref_H$ is a maximum voltage of the reference voltage group $V_{NR}$. The predetermined reference voltage $Vref_L$ is a minimum voltage of the reference voltage group $V_{NR}$.

In one embodiment, the calibration function of the calibration unit 117 is integrated with the analog-to-digital unit 115. In this embodiment, the calibration unit 117 adjusts at least one of the reference voltages $Vref_H$ and $Vref_L$ of the reference voltage group $V_{NR}$ according to the digital codes $V_{ADC1}$ and $V_{ADC2}$.

Figure 2A:
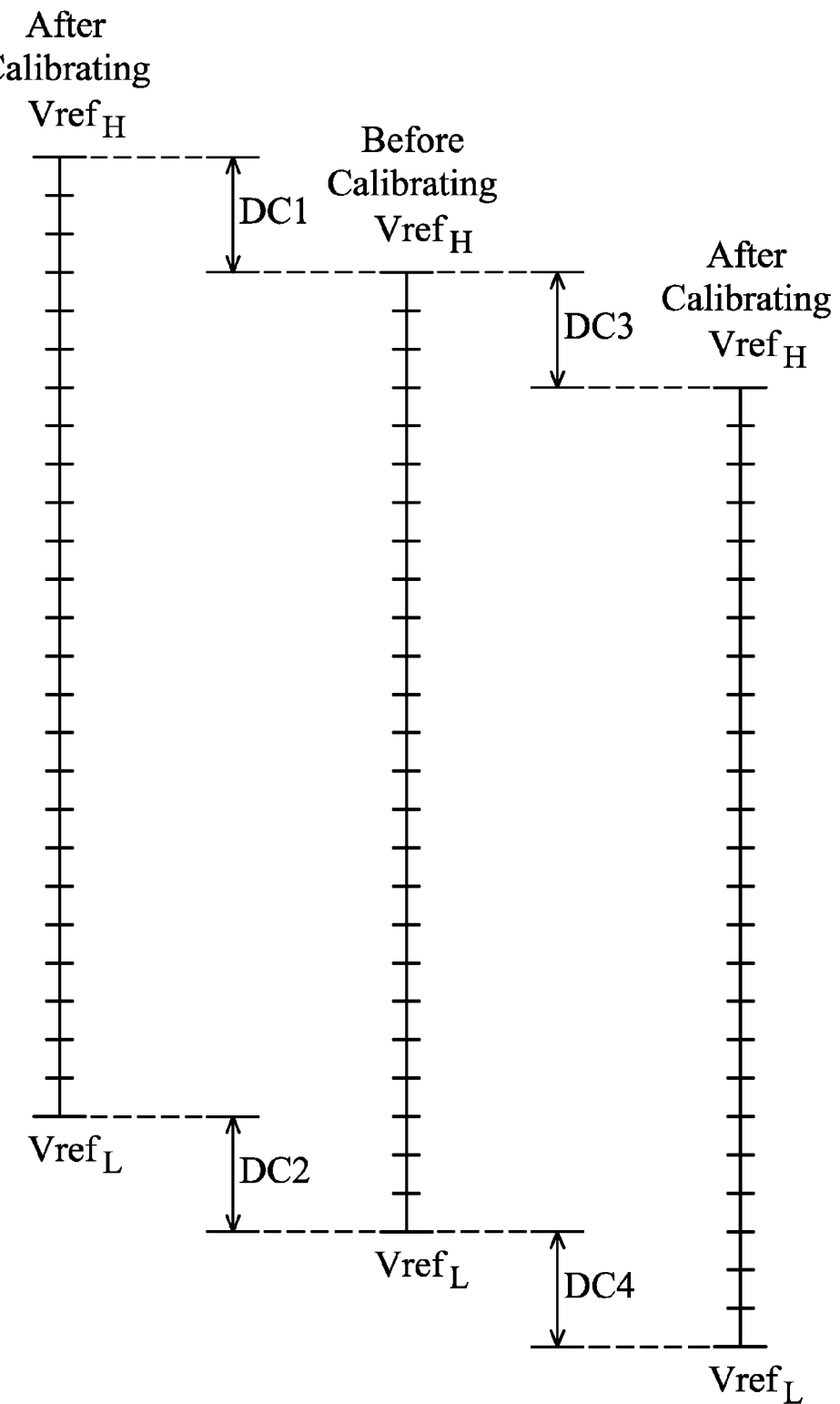
FIG. 2A is a schematic diagram of the reference voltages $Vref_H$ and $Vref_L$ before and after compensating for the DC offset.

FIG. 2A is a schematic diagram of the reference voltages $Vref_H$ and $Vref_L$ before and after compensating for the DC offset. In one embodiment, after compensating for the reference voltage $Vref_H$, a positive shift amount DC1 occurs between the compensated reference voltage $Vref_H$ and the original reference voltage $Vref_H$. In this case, a positive shift amount DC2 occurs between the compensated reference voltage $Vref_L$ and the original reference voltage $Vref_L$. The shift amount DC2 is equal to the shift amount DC1.

In another embodiment, a negative shift amount DC3 occurs between the compensated reference voltage $Vref_H$ and the original reference voltage $Vref_H$. In this case, a negative shift amount DC4 occurs between the compensated reference voltage $Vref_L$ and the original reference voltage $Vref_L$. The shift amount DC4 is equal to the shift amount DC3.

Figure 2B:
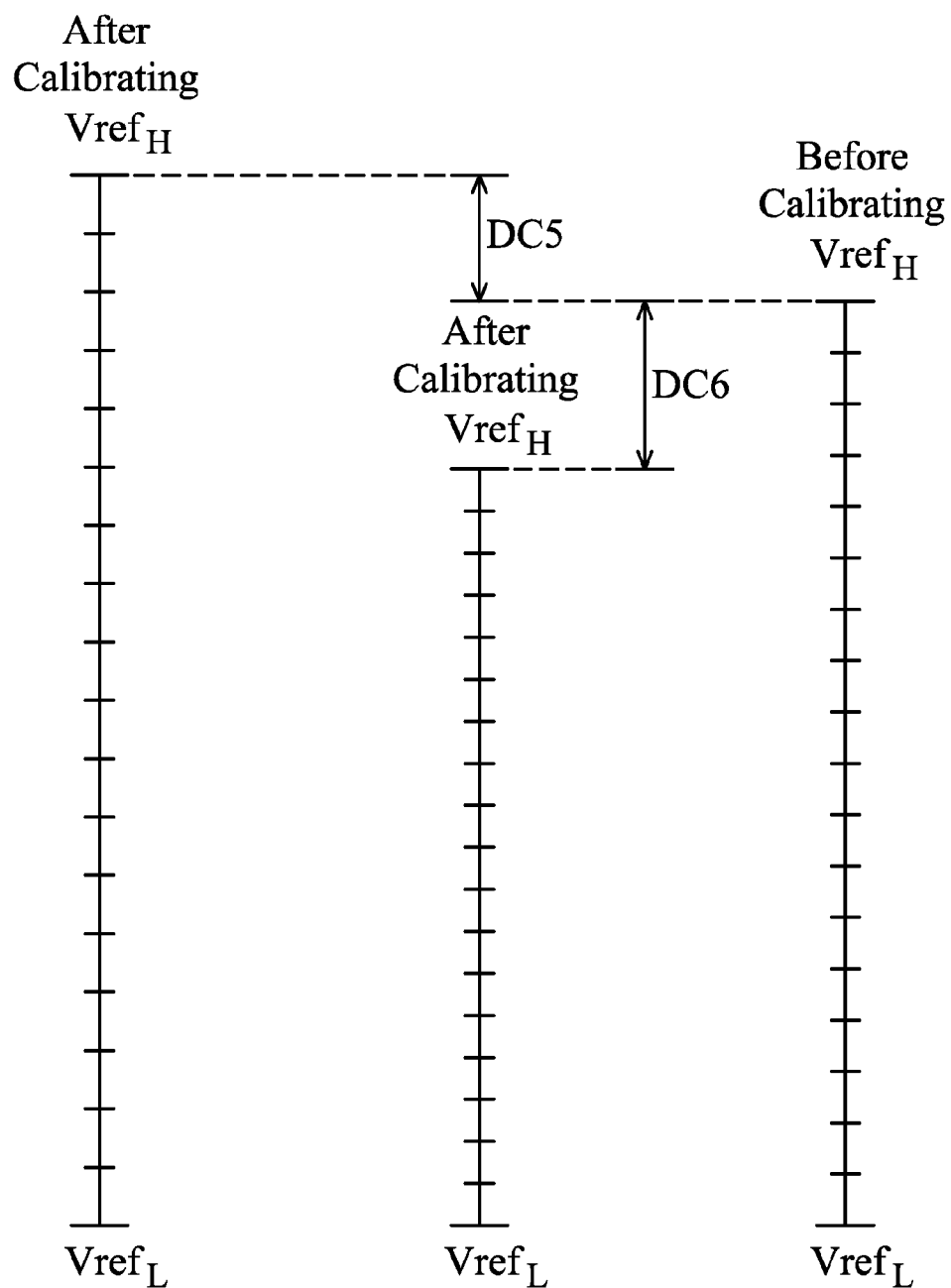
FIGS. 2B and 2C are schematic diagrams of the reference voltages $Vref_H$ and $Vref_L$ before and after compensating for the gain error.
Figure 2C:
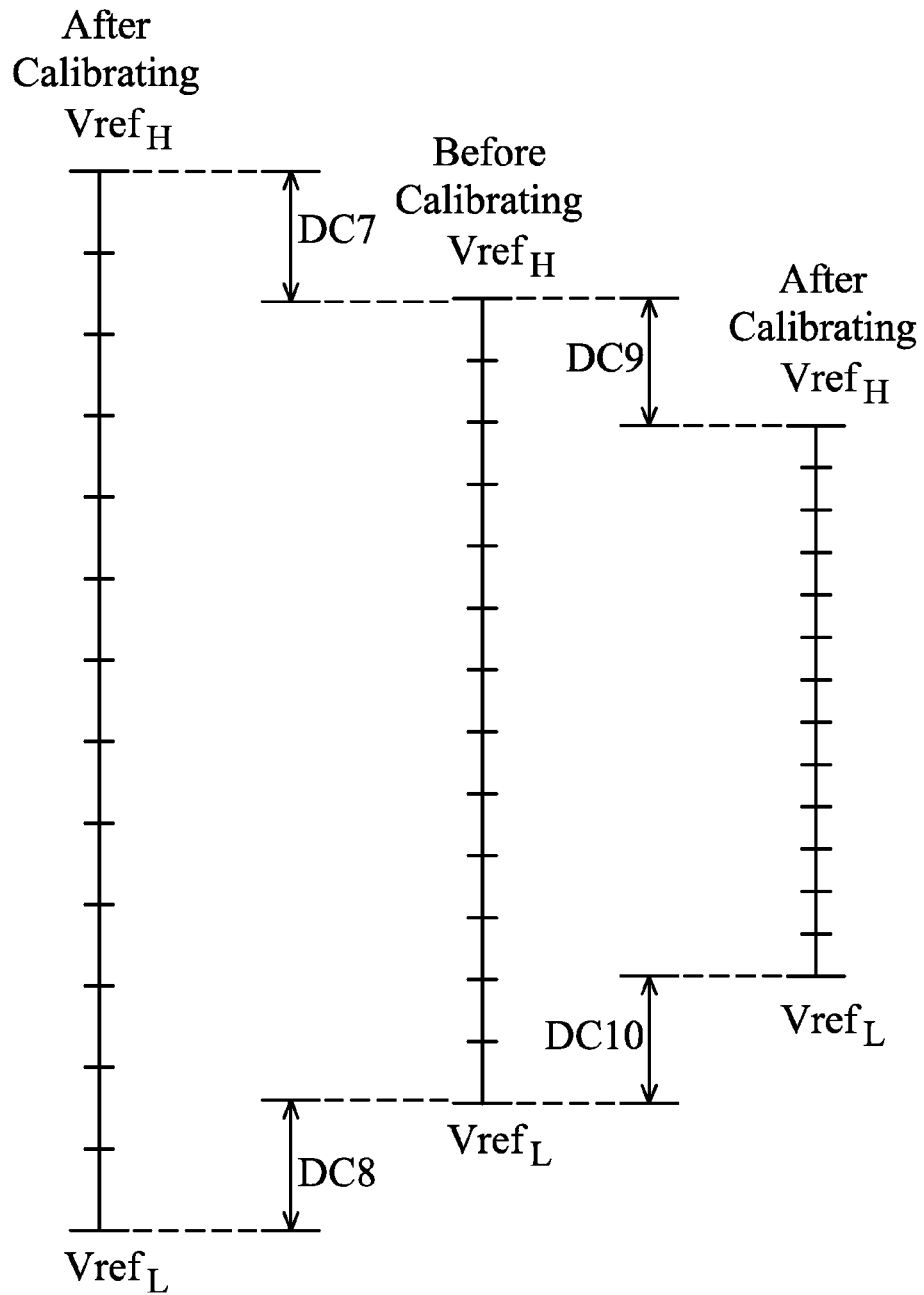

FIGS. 2B and 2C are schematic diagrams of the reference voltages $Vref_H$ and $Vref_L$ before and after compensating for the gain error. Refer to FIG. 2B, the reference voltage $Vref_L$ is maintained before and after compensating for the gain error. The calibration unit 117 only adjusts (increases or reduces) the reference voltage $Vref_H$. In FIG. 2B, a positive shift amount DC5 or a negative shift amount DC6 occurs between the compensated reference voltage $Vref_H$ and the original reference voltage $Vref_H$.

In another embodiment, as shown in FIG. 2C, the calibration unit 117 adjust the reference voltages $Vref_H$ and $Vref_L$ to increase or reduce the range between the reference voltages $Vref_H$ and $Vref_L$. In this case, a positive shift amount DC7 or a negative shift amount DC9 occurs between the compensated reference voltage $Vref_H$ and the original reference voltage $Vref_H$. Similarly, a positive shift amount DC10 or a negative shift amount DC8 occurs between the compensated reference voltage $Vref_L$ and the original reference voltage $Vref_L$.

The disclosure does not limit the relationship among the shift amounts DC7~DC10. In one embodiment, the shift amount DC7 is equal or unequal to the shift amount DC8. Similarly, the shift amount DC9 is equal or unequal to the shift amount DC10.

After finishing the calibration actions of the first and the second calibration mode, the DC offset and the gain error of the processing device 110 are compensated for. Thus, the processing device 110 enters a normal mode. During the normal mode, the calibration unit 117 provides the adjusted predetermined reference voltages $Vref_H$ and $Vref_L$ to the analog-to-digital unit 115. The analog-to-digital unit 115 processes the output signal of the processing module 111 according to the adjusted predetermined reference voltages $Vref_H$ and $Vref_L$.

For example, during the normal mode, the sensing device 130 generates a sensed signal Ssen. The level shifting unit 112 transforms the sensed signal Ssen to generate the transformed signal $S_{LS}$. The amplifying unit 113 amplifies the transformed signal $S_{LS}$ to generate an amplified signal $S_{AS}$. The analog-to-digital unit 115 transforms the amplified signal $S_{AS}$ to the digital code $D_N$ according to the adjusted predetermined reference voltages $Vref_H$ and $Vref_L$. The amplified signal $S_{AS}$ is in an analog format, and the digital code $D_N$ is in a digital format.

The disclosure does not limit the internal circuit structure of the processing device 110. The embodiments of the processing device 110 are described in the following. The processing device 110 may comprise a level shifting unit 112, an amplifying unit 113, an analog-to-digital unit 115 and a calibration unit 117, but the disclosure is not limited thereto.

Figure 3A:
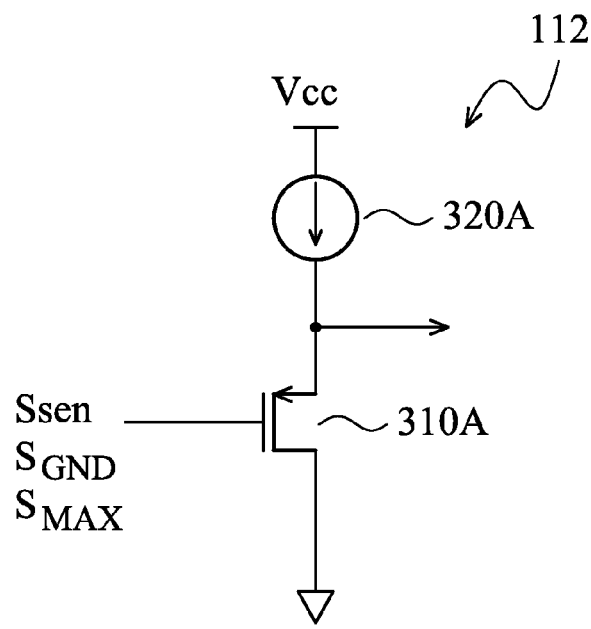
FIGS. 3A~3C are schematic diagrams of exemplary embodiments of a level shifting unit.
Figure 3B:
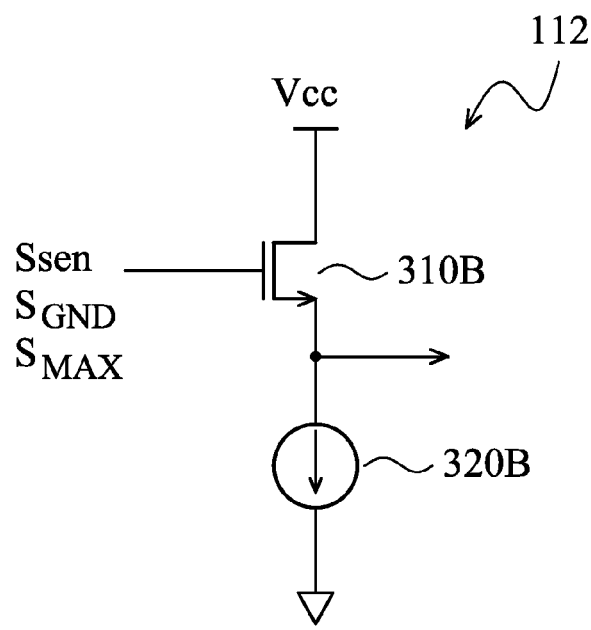
Figure 3C:
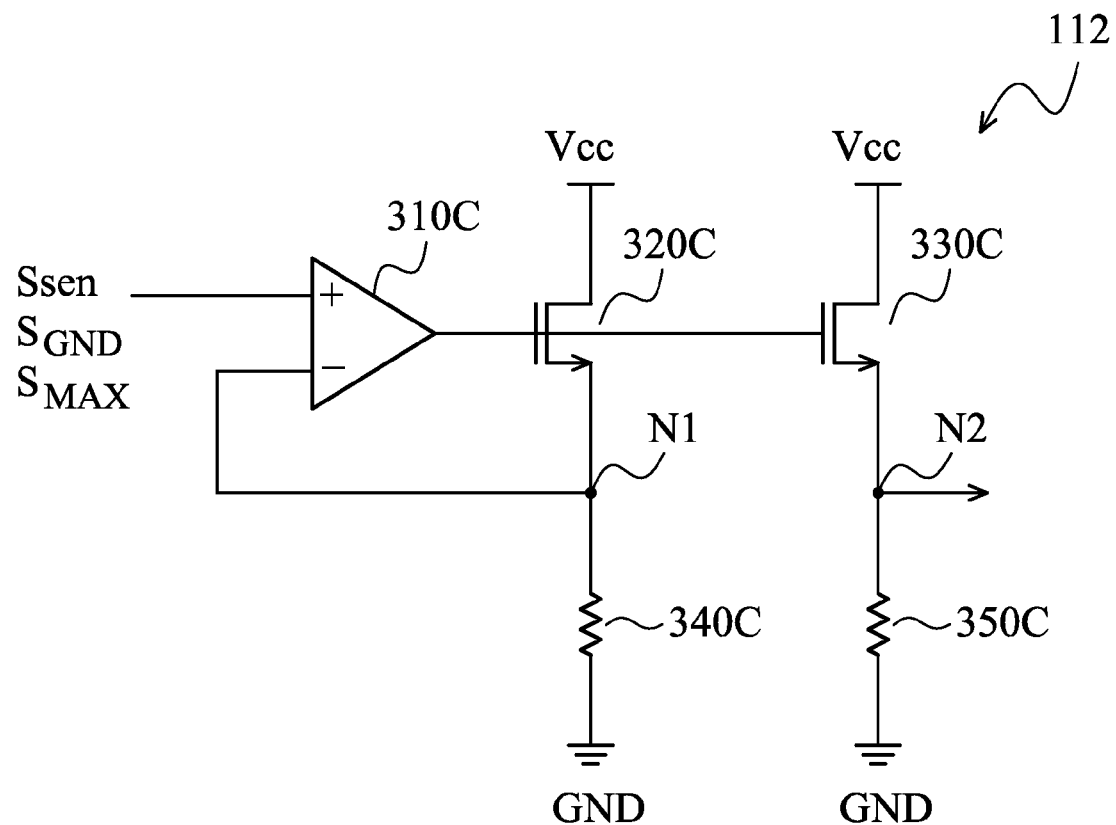

FIGS. 3A~3C are schematic diagrams of exemplary embodiments of the level shifting unit. In FIG. 3A, the level shifting unit 112 comprises a P-type transistor 310A and a current source 320A. The gate of the P-type transistor 310A receives the sensed signal Ssen, the grounded signal $S_{GND}$ or the predetermined signal $S_{MAX}$. The source of the P-type transistor 310A is coupled to the current source 320A and the amplifying unit 113.

In FIG. 3B, the level shifting unit 112 comprises a N-type transistor 310B and a current source 320B. The gate of the N-type transistor 310B receives the sensed signal Ssen, the grounded signal $S_{GND}$ or the predetermined signal $S_{MAX}$. The drain of the N-type transistor 310B receives voltage Vcc and the source of the N-type transistor 310B is coupled to the current source 320B and the amplifying unit 113.

In FIG. 3C, the level shifting unit 112 comprises an amplifier 310C, N-type transistors 320C, 330C and resistors 340C, 350C. The non-inverting input of the amplifier 310C receives the sensed signal Ssen, the grounded signal $S_{GND}$ or the predetermined signal $S_{MAX}$. The inverting input of the amplifier 310C is coupled to a node N1. The N-type transistor 320C is serially connected to the resistor 340C between the operation voltages Vcc and GND. A node N2 is coupled to the amplifying unit 113.

Figure 4A:
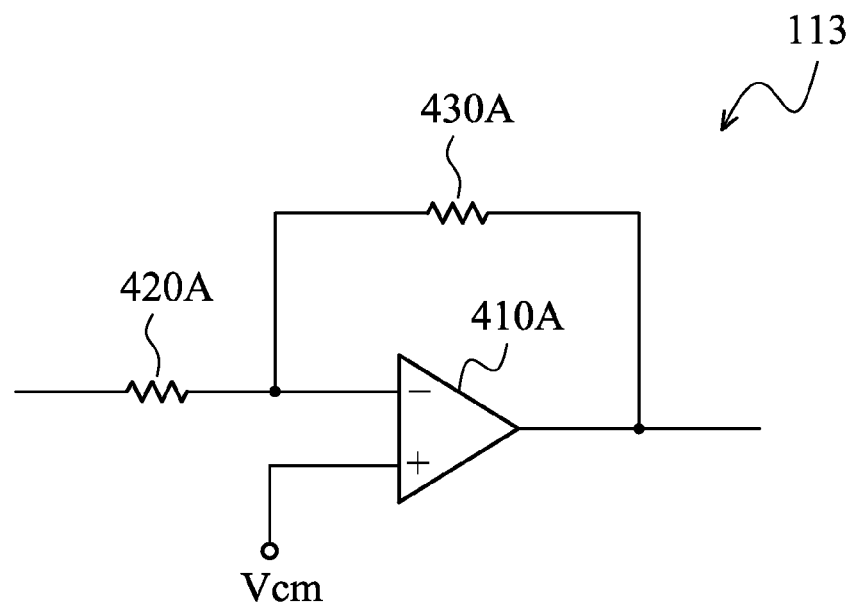
FIGS. 4A and 4B are schematic diagrams of exemplary embodiments of an amplifying unit.
Figure 4B:
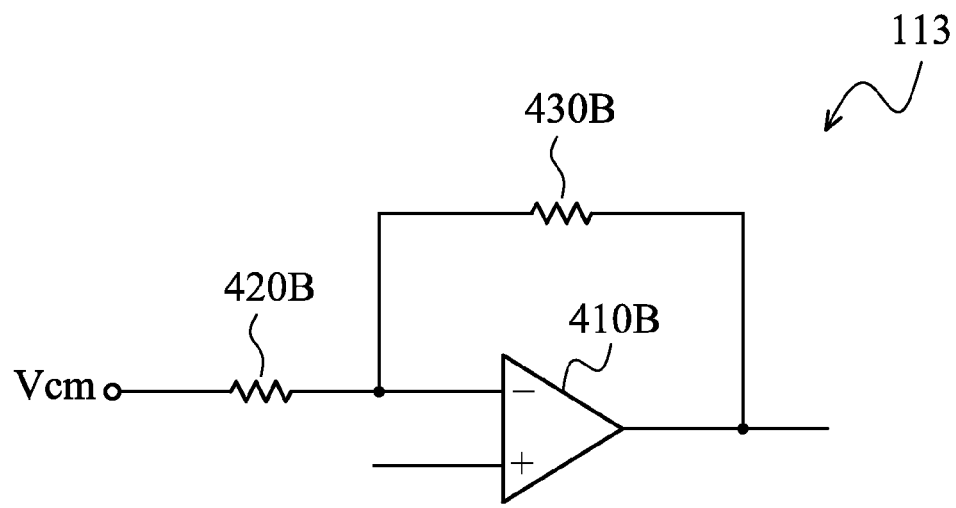

FIGS. 4A and 4B are schematic diagrams of exemplary embodiments of the amplifying unit. In FIG. 4A, the amplifying unit 113 comprises an amplifier 410A and resistors 420A and 430A. The inverting input of the amplifier 410A is coupled to the level shifting unit 112 via the resistor 420A. The non-inverting input of the amplifier 410A receives a middle voltage Vcm. The resistor 430A is coupled between the inverting input and the output of the amplifier 410A. The output of the amplifier 410A is coupled to the analog-to-digital unit 115.

In FIG. 4B, the amplifying unit 113 comprises an amplifier 410B and resistors 420B and 430B. The inverting input of the amplifier 410B receives a middle voltage Vcm via the resistor 420B. The non-inverting input of the amplifier 410B is coupled to the level shifting unit 112. The output of the amplifier 410B is coupled to the analog-to-digital unit 115. The resistor 430B is coupled between the inverting input and the output of the amplifier 410B.

Figure 5A:
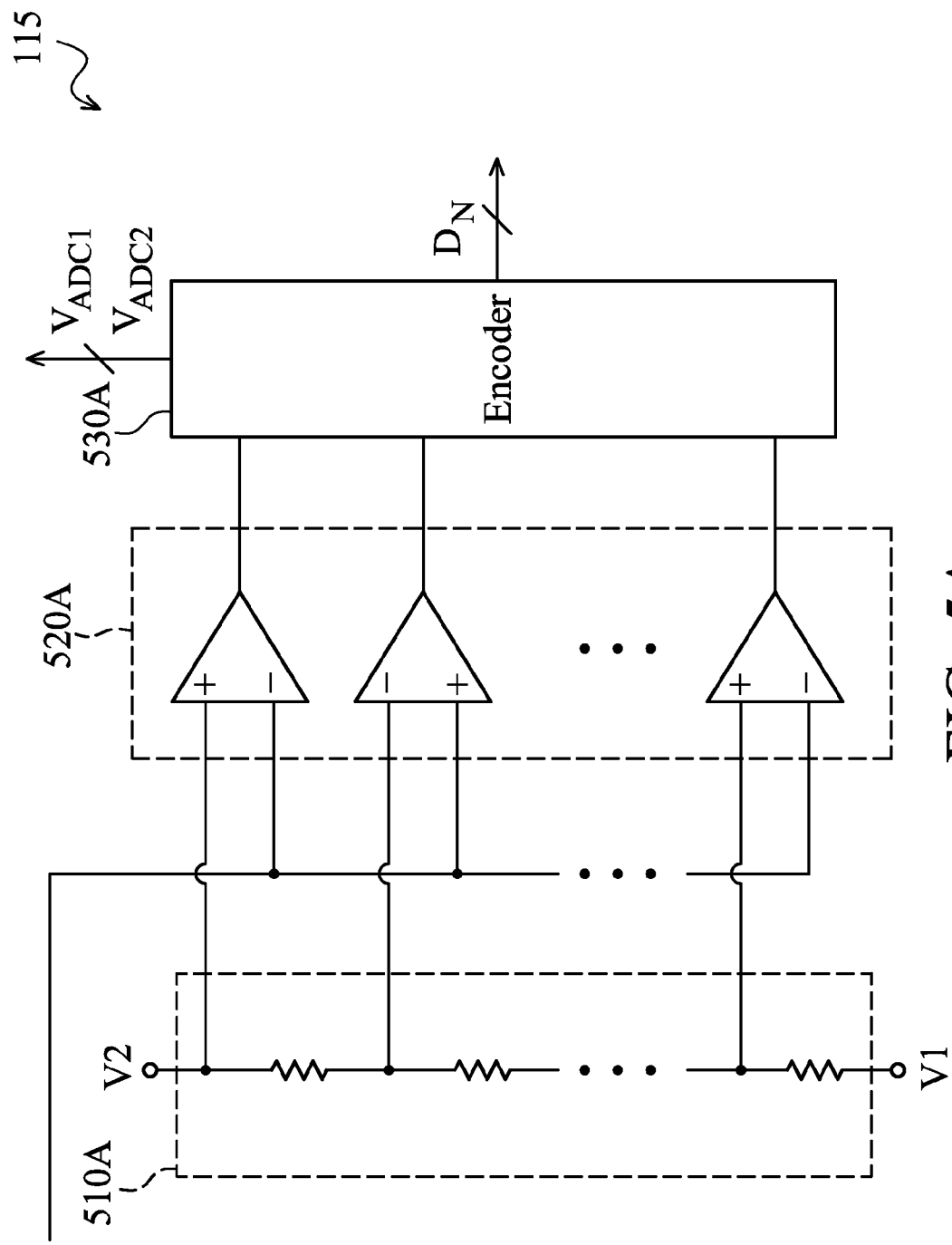
FIGS. 5A and 5B are schematic diagrams of exemplary embodiments of an analog-to-digital unit.
Figure 5B:
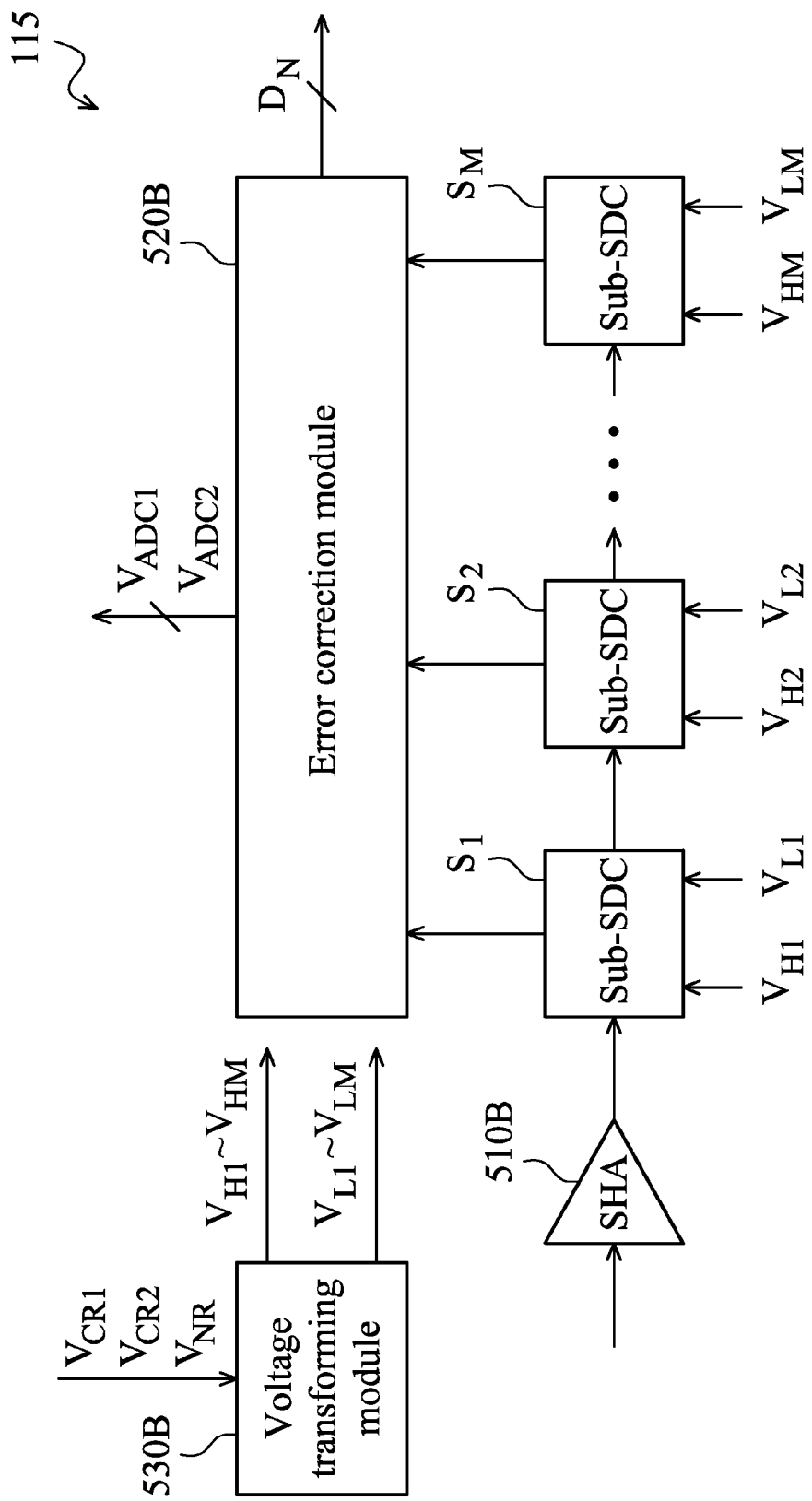

FIGS. 5A and 5B are schematic diagrams of exemplary embodiments of the analog-to-digital unit. In FIG. 5A, the analog-to-digital unit 115 is a flash ADC. Since the operation of the flash ADC is well known to those skilled in the art, description thereof is omitted. In one embodiment, the analog-to-digital unit 115 comprises a resistor string 510A, a comparing module 520A and an encoder 530A. The resistor string 510A is coupled between the reference voltages V1 and V2 to provide various division voltages.

In different modes, the voltages V1 and V2 corresponds to different reference voltage groups. For example, during the first calibration mode, the voltage V1 is the minimum voltage of the reference voltage group $V_{CR1}$ and the voltage V2 is the maximum voltage of the reference voltage group $V_{CR1}$. During the second calibration mode, the voltage V1 is the minimum voltage of the reference voltage group $V_{CR2}$ and the voltage V2 is the maximum voltage of the reference voltage group $V_{CR2}$. During the normal mode, the voltage V1 is the minimum voltage ($Vref_L$) of the reference voltage group $V_{NR}$ and the voltage V2 is the maximum voltage ($Vref_H$) of the reference voltage group $V_{NR}$.

The comparing module 520A is coupled between the resistor string 510A and the encoder 530A and receives the division voltages generated by the resistor string 510A. The encoder 530A generates the digital code $V_{ADC1}$, $V_{ADC2}$ or $D_N$ according to the output signal of the comparing module 520A.

In FIG. 5B, the analog-to-digital unit 115 is a pipeline ADC and comprises a sample hold amplifier (SHA) 510B, a sub-ADC $S_1$~$S_M$, an error correction module 520B and a voltage transforming module 530B. Since the operation of the pipeline ADC is well known to those skilled in the art, description thereof is omitted.

In this embodiment, the voltage transforming module 530B generates voltage levels $V_{H1}$~$V_{HM}$ and $V_{L1}$~$V_{LM}$ according to different reference voltage groups during different modes. The sub-ADCs $S_1 \sim S_M$ operate according to the corresponding voltage levels. For example, during the first calibration mode, the voltage transforming module 530B generates voltage levels $V_{H1} \sim V_{HM}$ and $V_{L1} \sim V_{LM}$ according to the reference voltage group $V_{CR1}$. During the second calibration mode, the voltage transforming module 530B generates voltage levels $V_{H1} \sim V_{HM}$ and $V_{L1} \sim L_{LM}$ according to the reference voltage group $V_{CR2}$. During the normal mode, the voltage transforming module 530B generates voltage levels $V_{H1} \sim V_{HM}$ and $V_{L1} \sim V_{LM}$ according to the reference voltage group $V_{NR}$.

Figure 6A:
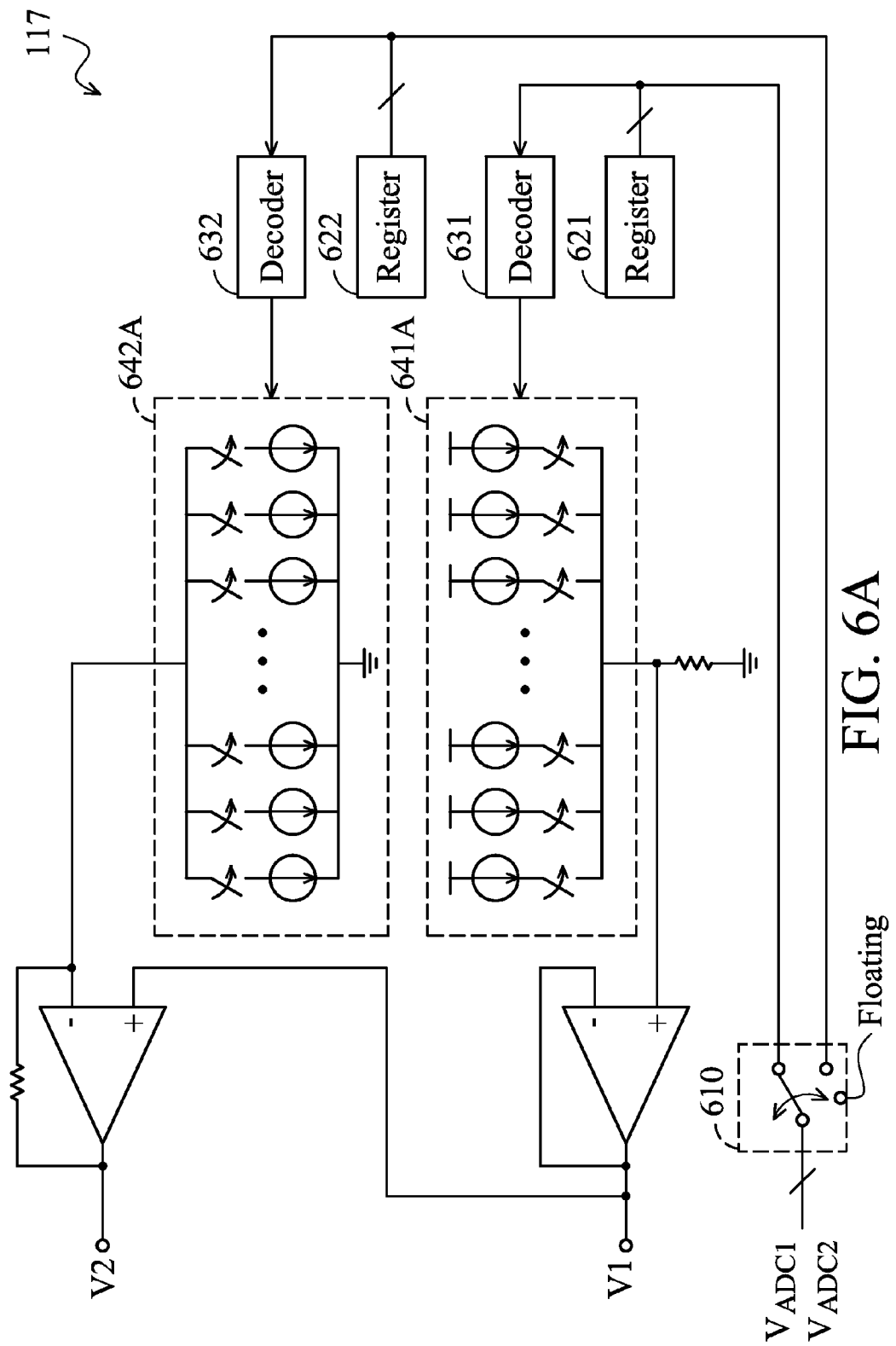
FIG. 6A is a schematic diagram of an exemplary embodiment of a calibration unit.

FIG. 6A is a schematic diagram of an exemplary embodiment of the calibration unit 117. In this embodiment, the registers 621 and 622 store predetermined values respectively. The decoder 631 decodes the predetermined value in the register 621. The decoder 632 decodes the predetermined value in the register 622. The current-steering DAC 641A generates a reference voltage V1 according to the decoded result generated by the decoder 631. The current-steering DAC 642A generates a reference voltage V2 according to the decoded result generated by the decoder 632. At this time, the reference voltage V1 serves as the minimum voltage of the reference voltage group $V_{CR1}$, and the reference voltage V2 serves as the maximum voltage of the reference voltage group $V_{CR1}$.

In the first calibration mode, an external analog-to-digital unit (e.g. 115) generates a digital code (e.g. $V_{ADC1}$) according to the reference voltages V1 and V2. The switching module 610 transmits the digital code (e.g. $V_{ADC1}$) to the register 621. The original data stored in the register 621 is replaced by the digital code (e.g. $V_{ADC1}$). Thus, the decoder 631 controls the current-steering DAC 641A to adjust the reference voltages V1 and V2 according to the stored digital code (e.g. $V_{ADC1}$) in the register 621. At this time, the adjusted reference voltage V1 serves as the minimum voltage of the reference voltage group $V_{CR2}$, and the reference voltage V2 serves as the maximum voltage of the reference voltage group $V_{CR2}$.

In the second calibration mode, the external analog-to-digital unit (e.g. 115) generates a digital code (e.g. $V_{ADC2}$) according to the adjusted reference voltages V1 and V2. The switching module 610 transmits the digital code (e.g. $V_{ADC2}$) to the register 622. The original data stored in the register 622 is replaced by the digital code (e.g. $V_{ADC2}$). Thus, the decoder 632 controls the current-steering DAC 642A to again adjust at least one of the reference voltages V1 and V2 according to the stored digital code (e.g. $V_{ADC2}$) in the register 622. In this embodiment, only the reference voltage V2 is adjusted, and the reference voltage V1 is maintained. The adjusted reference voltage V2 and the maintained reference voltage V1 are as shown in FIG. 2B. At this time, the reference voltage V1 serves as the minimum voltage of the reference voltage group $V_{NR}$, and the adjusted reference voltage V2 serves as the maximum voltage of the reference voltage group $V_{NR}$.

In the normal mode, the external analog-to-digital unit (e.g. 115) generates a digital code (e.g. $D_N$) according to the finishing reference voltages V1 and V2. In this embodiment, a DC offset is compensated for when the switching module 610 transmits the digital code (e.g. $V_{ADC1}$) to the register 621 and the decoder 631 controls the current-steering DAC 641A according to the stored digital code (e.g. $V_{ADC1}$) in the register 621. Also, a gain error is compensated for when the switching module 610 transmits the digital code (e.g. $V_{ADC2}$) to the register 622 and the decoder 632 controls the current-steering DAC 642A according to the stored digital code (e.g. $V_{ADC2}$) in the register 622. During the normal mode, the data stored (e.g. $V_{ADC1}$ and $V_{ADC2}$) in the registers 621 and 622 is maintained.

Additionally, the digital codes $V_{ADC1}$ and $V_{ADC2}$ comprise a multitude of bits such that the switching module 610 is a switch array. For brevity, the switching module 610 only shows a switch.

Figure 6B:
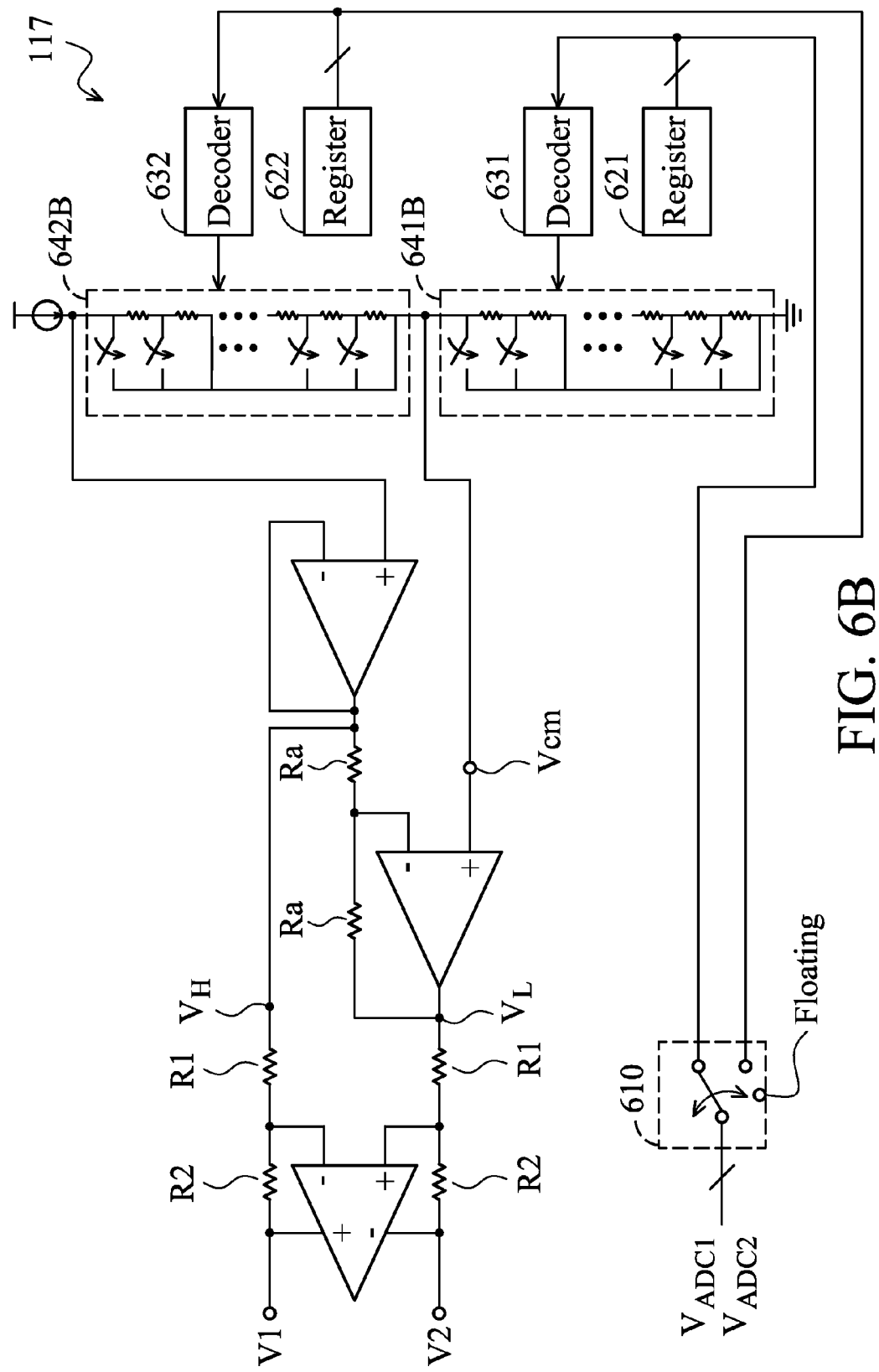
FIG. 6B is a schematic diagram of another exemplary embodiment of the calibration unit.

FIG. 6B is a schematic diagram of another exemplary embodiment of the calibration unit 117. Since FIGS. 6A and 6B have the same principle, description of FIG. 6B is omitted. In this embodiment, the reference voltages V1 and V2 are adjusted and a middle voltage Vcm is maintained during the second calibration mode. The adjusted result is as shown in FIG. 2C. In FIG. 6A, each of the current-steering DAC 641A and 642A comprises a multitude of current sources and switches. In FIG. 6B, each of the resistor-steering DAC 641B and 642B comprises a multitude of resistors and switches.

Figure 7:
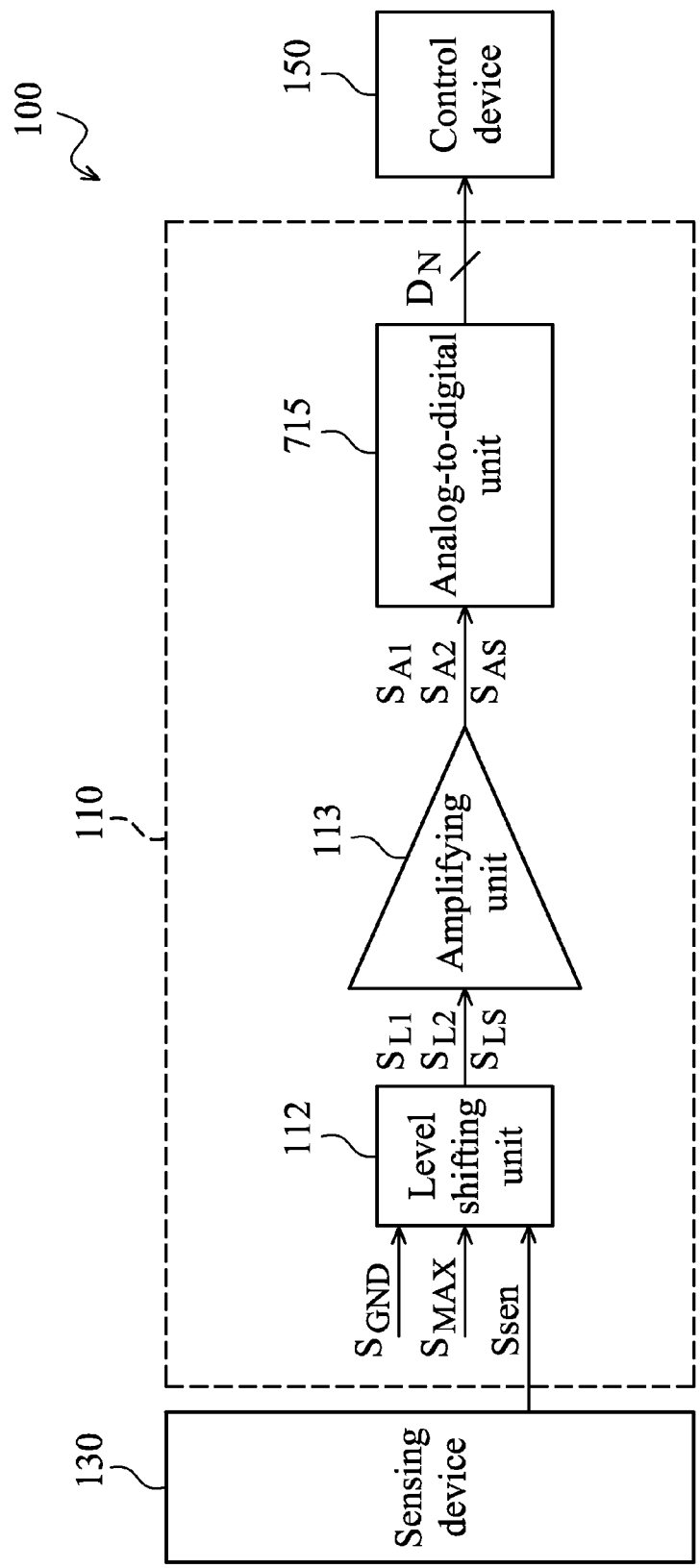
FIG. 7 is a schematic diagram of another exemplary embodiment of a processing system.

FIG. 7 is a schematic diagram of another exemplary embodiment of the processing system. FIG. 7 is similar to FIG. 1 with the exception that the analog-to-digital unit 715 has a calibration function to compensate for a DC offset and a gain error. In FIG. 7, all elements are described except the analog-to-digital unit 715, thus, the descriptions of the described elements are omitted. The operating principle of the analog-to-digital unit 715 is described in the following.

Figure 8A:
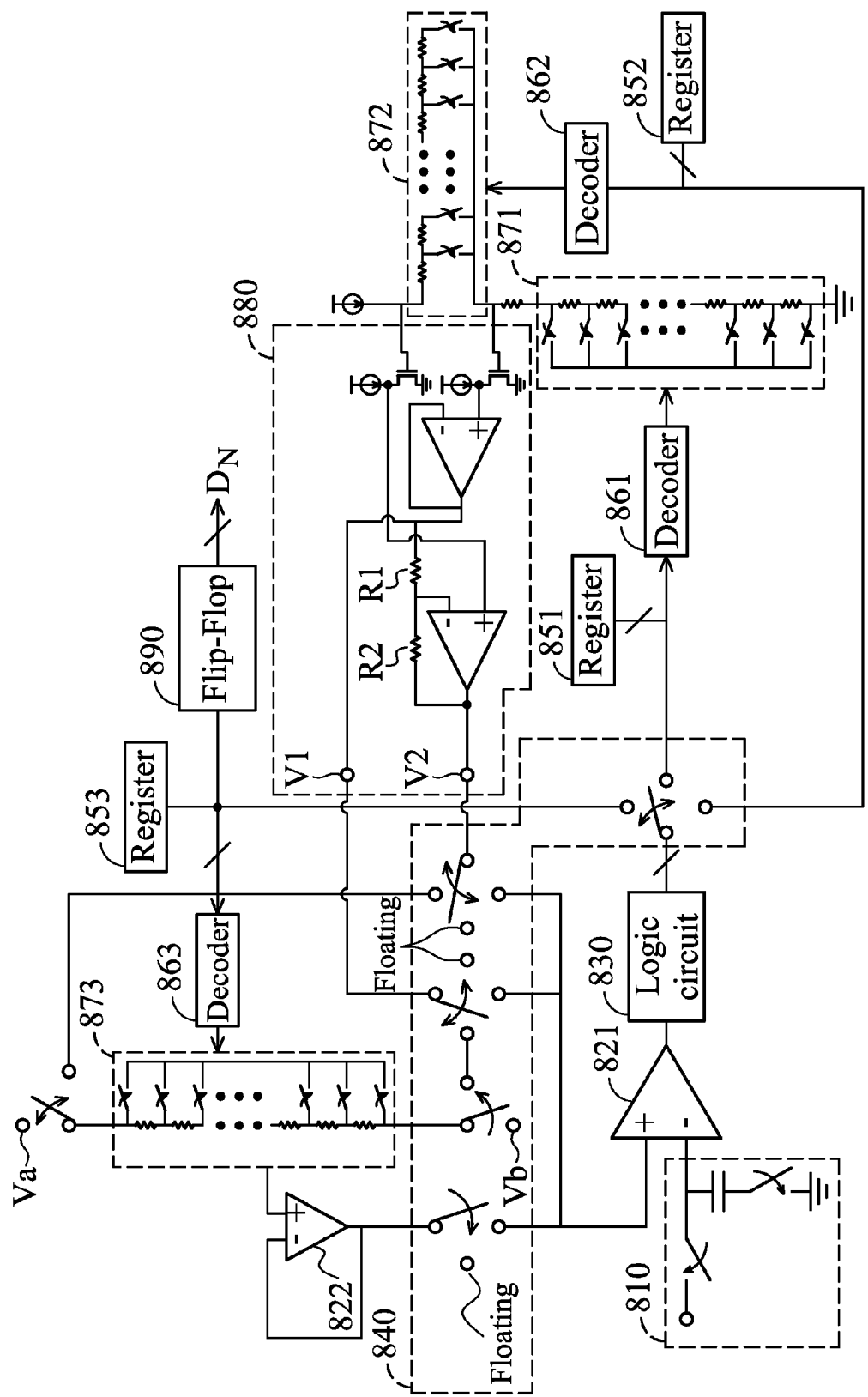
FIG. 8A is a schematic diagram of another exemplary embodiment of an analog-to-digital unit.
Figure 8B:
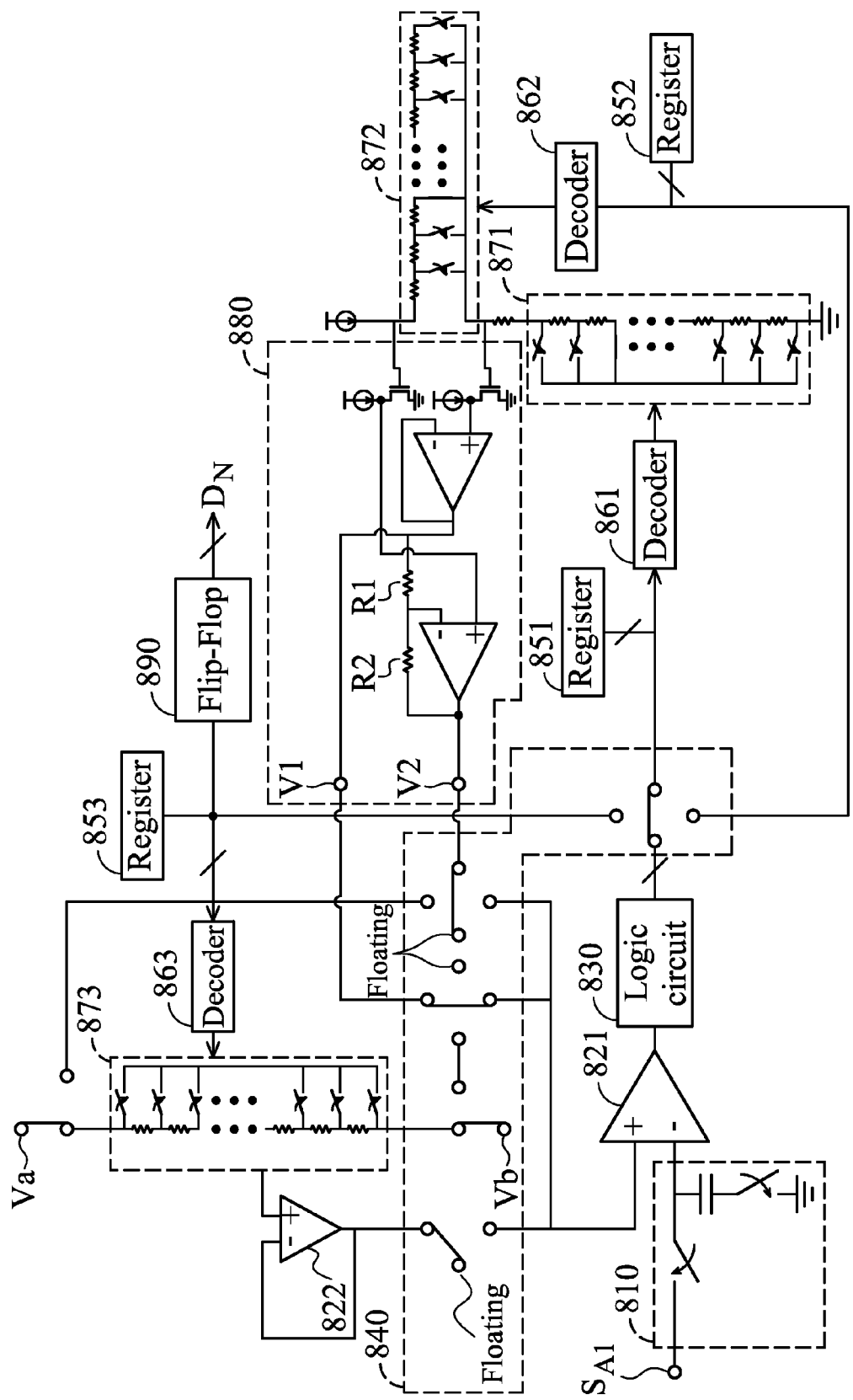
FIGS. 8B~8D show the operating principle of an analog-to-digital unit during different modes.
Figure 8C:
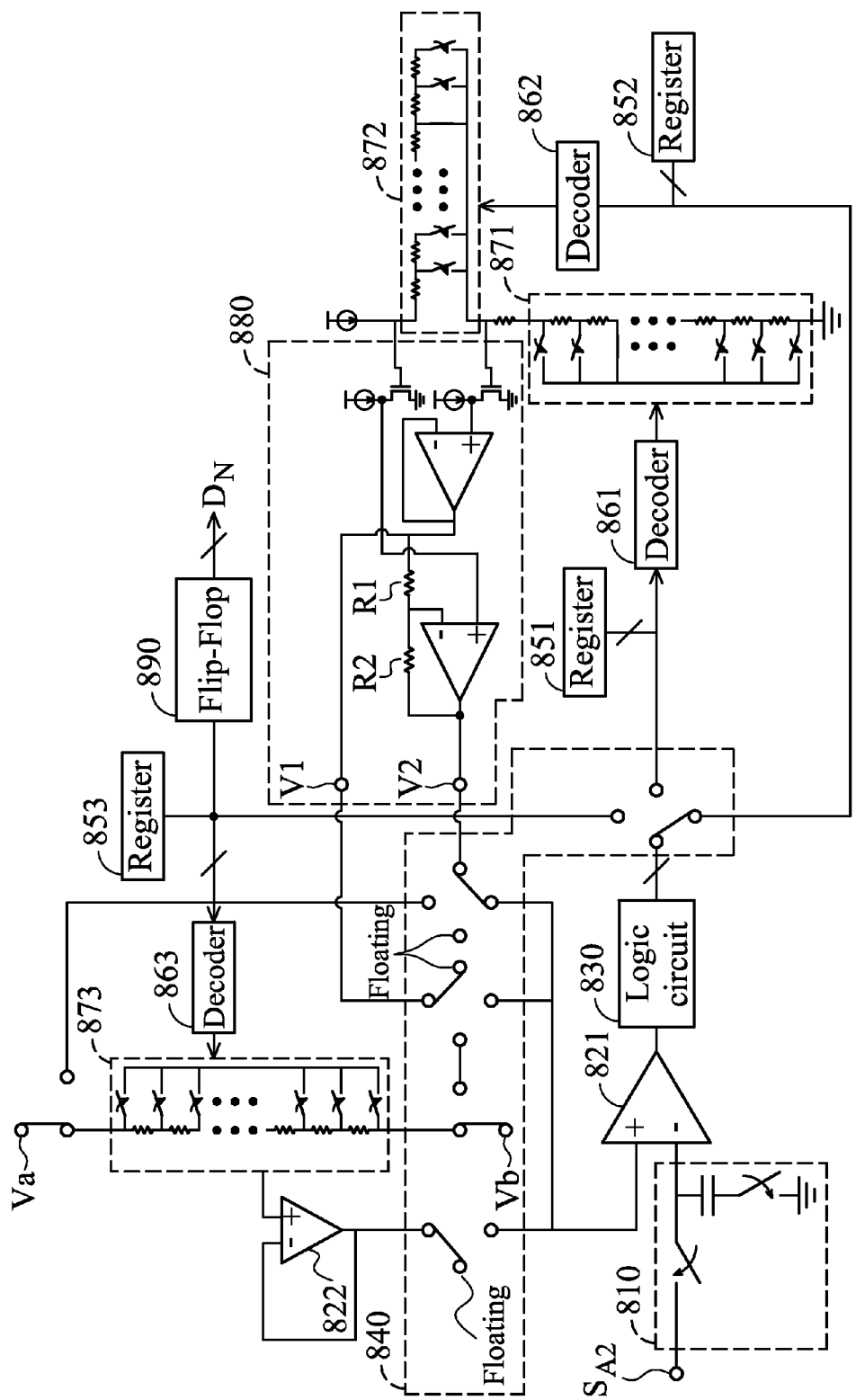
Figure 8D:
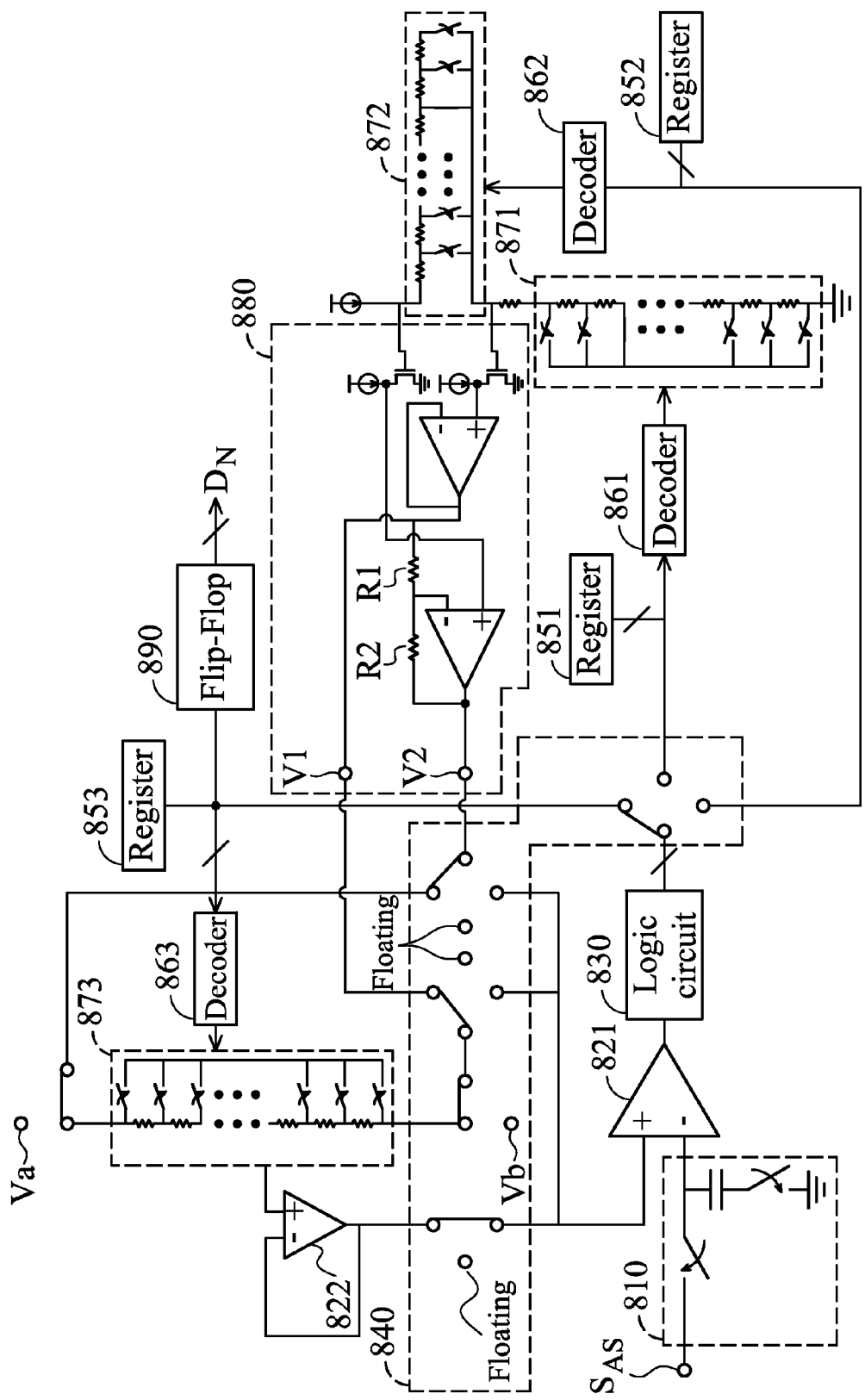

FIG. 8A is a schematic diagram of another exemplary embodiment of the analog-to-digital unit 715. The analog-to-digital unit 715 is a successive-approximation-register (SAR) ADC. This SAR ADC is capable of compensating for DC offset and gain error. FIGS. 8B~8D show the operating principle of the analog-to-digital unit 715 during different modes.

Refer to FIG. 8B, during the first calibration mode, the sample-hold circuit 810 samples and holds the amplified signal $S_{A1}$. The comparator 821 compares the output signal of the sample-hold circuit 810 with the reference voltage V1. In this embodiment, the reference voltage V1 is the minimum voltage of the reference voltage group $V_{CR1}$.

The logic circuit 830 receives the output of the comparator 821. In this embodiment, the logic circuit 830 is a ring counter. The switching module 840 transmits the digital code (e.g. $V_{ADC1}$) generated by the logic circuit 830 to the register 851. The decoder 861 controls the switches of the impedance module 871 according to the stored digital code in the register 851 such that the impedance module 871 provides impedance. The processing circuit 880 adjusts the reference voltages V1 and V2 according to the impedances provided by the impedance modules 871 and 872. The adjusted reference voltages V1 and V2 are as shown in FIG. 2A.

The disclosure does not limit the value of the impedance provided by the impedance module 872 during the first calibration mode. In one embodiment, the impedance module 872 provides middle impedance.

Refer to FIG. 8C, during the second calibration mode, the sample-hold circuit 810 samples and holds the amplified signal $S_{A2}$. The comparator 821 compares the output of the sample-hold circuit 810 with the reference voltage V2. In this embodiment, the reference voltage V2 is the maximum voltage of the reference voltage group $V_{CR2}$.

The logic circuit 830 receives the output of the comparator 821. The switching module 840 transmits the digital code (e.g. $V_{ADC2}$) generated by the logic circuit 830 to the register 852. The decoder 862 controls the switches of the impedance module 872 according to the stored digital code in the register 852 such that the impedance module 872 provides impedance. The processing circuit 880 adjusts the reference voltage V2 according to the impedances provided by the impedance modules 871 and 872. The adjusted reference voltage V2 is as shown in FIG. 2B.

Refer to FIG. 8D, during the normal mode, the impedance module 873 receives the adjusted reference voltages V1 and V2 (e.g. $Vref_L$ and $Vref_H$). The analog-to-digital unit 715 executes an analog-to-digital converting action to generate a digital code $D_N$ according to the finishing reference voltages V1 and V2.

Note that the disclosure does not limit the levels of reference voltages received by the impedance module 873 during the first and the second calibration modes. In one embodiment, the impedance module 873 receives the reference voltages Va and Vb during the first and the second calibration modes. The reference voltages Va and Vb are predetermined.

In other embodiments, the impedance module 873 is in a floating state and does not receive any voltage during the first and the second calibration modes. Additionally, the flip-flop 890 outputs the digital code $D_N$ according to the data stored in the register 853 during the normal mode.

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A processing system, comprising:
a first processing module transforming and amplifying a grounded signal to generate a first processed signal and transforming and amplifying a predetermined signal to generate a second processed signal; and
a second processing module transforming the first processed signal to a first digital code according to a first reference voltage group and transforming the second processed signal to a second digital code according to a second reference voltage group, wherein the second processing module adjusts a third reference voltage group according to the first and the second digital codes, and during a normal mode, the second processing module generates a third digital code according to the adjusted third voltage group.

2. The processing system as claimed in claim 1, wherein the second processing module comprises:
an analog-to-digital unit transforming the first processed signal to the first digital code according to the first reference voltage group and transforming the second processed signal to the second digital code according to the second reference voltage group; and
a calibration unit providing the first and the second reference voltage groups and adjusting the third reference voltage group according to the first and the second digital codes,
wherein during the normal mode, the analog-to-digital unit generates the third digital codes according to the adjusted third reference voltage group.

3. The processing system as claimed in claim 2, wherein the calibration unit is integrated with the analog-to-digital unit.

4. The processing system as claimed in claim 1, wherein the first processing module comprises:
a level shifting unit transforming the grounded signal to generate a first transformed signal and transforming the predetermined signal to generate a second transformed signal; and
an amplifying unit amplifying the first transformed signal to generate the first processed signal and amplifying the second transformed signal to generate the second processed signal.

5. The processing system as claimed in claim 1, further comprising:
a sensing device generating a sensed signal during the normal mode.

6. The processing system as claimed in claim 5, wherein the predetermined signal is a maximum sensed signal generated by the sensing device.

7. The processing system as claimed in claim 1, wherein during a first calibration mode, the first processing module transforms and amplifies the grounded signal to generate the first processed signal, and the second processing module transforms the first processed signal to generate the first digital code according to the first reference voltage group and adjusts at least one of a first predetermined reference voltage and a second predetermined reference voltage of the third reference voltage group according to the first digital code.

8. The processing system as claimed in claim 7, wherein during a second calibration mode, the first processing module transforms and amplifies the predetermined signal to generate the second processed signal, and the second processing module transforms the second processed signal to generate the second digital code according to the second reference voltage group and adjusts at least one of the first and the second predetermined reference voltages according to the second digital code.

9. The processing system as claimed in claim 8, wherein during the normal mode, the first processing module transforms and amplifies the sensed signal to generate a third processed signal, and the second processing module transforms the third processed signal to generate the third digital code according to the adjusted third reference voltage group.

10. The processing system as claimed in claim 8, wherein during the first and the second calibration modes, the second processing module adjusts the first and the second predetermined reference voltages, and the first predetermined reference voltage is less than the second predetermined reference voltage.

11. The processing system as claimed in claim 8, wherein during the first calibration mode, the second processing module adjusts the first and the second predetermined reference voltages, during the second calibration mode, the second processing module only adjusts the second predetermined reference voltage, and the second predetermined reference voltage is higher than the first predetermined reference voltage.

* * * * *